United States Patent [19]
Thurston

[11] Patent Number: 5,256,916
[45] Date of Patent: Oct. 26, 1993

[54] TTL TO CMOS TRANSLATING INPUT BUFFER CIRCUIT WITH DUAL THRESHOLDS FOR HIGH DYNAMIC CURRENT AND LOW STATIC CURRENT

[75] Inventor: Brian W. Thurston, Cumberland, Me.

[73] Assignee: National Semiconductor Corporation, Santa Clara, Calif.

[21] Appl. No.: 838,394

[22] Filed: Feb. 18, 1992

[51] Int. Cl.[5] .................. H03K 19/20; H03K 19/0175
[52] U.S. Cl. .................................... 307/451; 307/475; 307/360
[58] Field of Search ............... 307/475, 493, 451, 203, 307/300

[56] References Cited

U.S. PATENT DOCUMENTS

| | | | |
|---|---|---|---|
| 4,961,010 | 10/1990 | Davis | 307/451 |
| 4,999,529 | 3/1991 | Mogran, Jr. et al. | 307/443 |
| 5,051,624 | 9/1991 | Park | 307/443 |
| 5,065,224 | 3/1991 | Fraser et al. | 357/70 |
| 5,087,841 | 2/1992 | Rogers | 307/443 |
| 5,089,722 | 2/1992 | Ameded | 307/451 |
| 5,122,690 | 6/1992 | Bianchi | 307/443 |

*Primary Examiner*—Edward P. Westin
*Assistant Examiner*—Andrew Sanders
*Attorney, Agent, or Firm*—Daniel H. Kane; James W. Rose; Richard C. Calderwood

[57] ABSTRACT

A TTL to CMOS translating input buffer circuit receives TTL input data signals at an input ($V_{IN}$) and delivers CMOS data signals at an output ($V_{OUT}$). The input buffer circuit is provided with an expanded first stage with expanded pullup circuit (P1) and pulldown circuit (N1) having control gate nodes coupled to the input ($V_{IN}$). The pullup and pulldown circuits (P1,N1) are constructed to provide dual switching thresholds at the input ($V_{IN}$). A first stage output pullup and pulldown circuit (P1R,P1L,N1L) switches at a relatively lower first threshold voltage level. A pullup enhancer circuit (P1E,I3,I4) switches at a relatively higher second threshold voltage level. The pullup and pulldown circuits (P1,N1) of the expanded first stage are constructed for switching dynamic current at an output node (m1) at the relatively lower first threshold voltage level for data signal transitions between high and low potential levels at the output node (m1). The pullup enhancer circuit (P1E,I3,I4) switches static current ($I_{CCT}$) through the output node (m1) at the relatively higher second threshold voltage level to reduce static current ($I_{CCT}$) during a static low potential level data signal (L) at the output node (m1). The expanded pullup circuit (P1) incorporates a static current restricting first pullup transistor (P1R), a dynamic current enhancing second pullup transistor (P1E) coupled in parallel with the first pullup transistor (P1R), and at least one pullup current summing third pullup transistor (P1L,P1LA,P1LB) coupled to the output node (m1).

25 Claims, 6 Drawing Sheets

TTL TO CMOS TRANSLATING INPUT BUFFER CIRCUIT WITH DUAL THRESHOLDS FOR HIGH DYNAMIC CURRENT AND LOW STATIC CURRENT

TECHNICAL FIELD

This invention relates to a new input buffer circuit having an input for receiving data signals at TTL logic high and low potential levels and an output for delivering data signals at CMOS logic high and low potential levels. The invention provides an expanded first stage with enhanced dynamic pullup current during LH transitions at an intermediate output node in response to the HL transitions at the input to increase switching speed. The invention also reduces static current $I_{CCT}$ by restricting pullup current through the first stage during a steady state high potential level data signal H at the input and a corresponding steady state low potential level data signal L at the intermediate output node. The expanded input stage switches data signal voltage levels at a lower TTL first threshold voltage level and switches the enhancing pullup current at a higher specified second threshold voltage level. In the expanded first stage, pullup current is controlled from the input by a network of multiple pullup transistors coupled in parallel and in series. The dual threshold input buffer circuit parameters are scaleable and programmable according to the circuit application.

BACKGROUND ART

A prior art TTL to CMOS translating input buffer circuit consisting of first and second CMOS inverter stages is illustrated in FIG. 1. The first inverter stage P1,N1 is coupled between the input $V_{IN}$ and an intermediate output node m1. The second inverter stage P2, N2 is coupled between the intermediate node m1 and the output $V_{OUT}$. The inverter stages P1,N1 and P2,N2 are coupled between high and low potential power rails $V_{CCQ}$ and GNDQ. The high potential power rail $V_{CCQ}$ voltage at, for example 5.0 v, and the low potential power rail GNDQ voltage at, for example 0 v, represent the CMOS logic high and low potential levels.

TTL high and low potential level data signals, typically 2.0–2.4 v high and 0.4–0.8 v low are applied at the input $V_{IN}$. The ratio of respective channel widths of the PMOS pullup transistor P1 and NMOS pulldown transistor N1 of the first inverter stage is skewed to provide a TTL switching threshold voltage level at the input $V_{IN}$ of typically 1.5 v. To achieve this TTL switching threshold voltage, the ratio of channel widths P1/N1 is typically ¼.

An LH transition to a TTL high potential level data signal H at the input $V_{IN}$ turns on the NMOS pulldown transistor N1 to cause a low potential data signal L at the intermediate output node m1. The TTL high potential signal H is not sufficient however to complete turn off of PMOS pullup transistor P1 causing an unwanted static current or crowbar current $I_{CCT}$ to flow through P1 and N1 during a steady state low potential data signal L at the intermediate node m1. Transistor P1 is therefore sized for a small channel width to restrict and limit the undesirable power dissipating static current $I_{CCT}$ to an acceptable specified level.

Typical values for channel widths of P1/N1 are, for example, 25 μ/100 μ for the same channel length. While this skewed ratio and small size P1 channel width limits static current $I_{CCT}$ to a specified level, it slows the LH transition from low to high potential level at intermediate output node m1. Data signals reach the CMOS logic power rail voltage levels of 0 v and 5.0 v at the intermediate node m1 but with reduced speed and with unwanted power dissipation.

Intermediate node m1 drives the second CMOS inverter stage P2,N2 which is selected to have channel widths in a standard ratio range of for example 1/1 to ½. Example values for channel widths of P2,N2 are, for example 150 μ/150 μ for the same channel length. The second CMOS inverter stage P2,N2 with standard ratio channel widths switches at the CMOS threshold voltage of e.g. 2.5 v and completes the non-skewed translation to CMOS logic high and low potential level data signals at the output $V_{OUT}$. Output signals at $V_{OUT}$ are available to drive other CMOS or BICMOS circuits.

OBJECTS OF THE INVENTION

It is therefore an object of the present invention to overcome the pullup current path restriction of a reduced channel width first inverter stage pullup transistor in TTL to CMOS translating input buffer circuits. A purpose of the invention is to provide enhanced dynamic pullup current during LH transitions at the intermediate output node in response to HL transitions at the input to increase switching speed.

At the same time, another object of the invention is to restrict the pullup current through the first inverter stage during steady state low potential data signals L at the intermediate output node to meet reduced static current $I_{CCT}$ specifications.

DISCLOSURE OF THE INVENTION

In order to accomplish these results, the invention provides a new input buffer circuit with an expanded first stage or input stage. The first stage is constructed to provide dual input switching voltage thresholds at the input. The first stage output pullup and pulldown circuit switches at a relatively lower first threshold voltage level. A pullup enhancer circuit switches at a relatively higher second threshold voltage level.

According to the preferred example embodiment of the invention, the first stage output pullup and pulldown circuit of the expanded first stage is constructed for switching dynamic current at an output node m1 at the relatively lower first threshold voltage level for data signal transitions between high and low potential levels at the output node. The pullup enhancer circuit is constructed for switching static current $I_{CCT}$ through the intermediate output node m1 at the relatively higher second threshold voltage level to reduce static current $I_{CCT}$ during a static low potential level data signal at the output node m1. The relatively lower first threshold voltage level is selected to be substantially at a TTL input switching threshold while the relatively higher second threshold voltage level is selected to be substantially at a CMOS input switching threshold.

Broadly conceived, the invention thus provides a new method of buffering input data signals at the input of an input buffer circuit having a first stage output pullup and pulldown circuit coupled to an output node. The method steps include switching the first stage output pullup and pulldown circuit at a relatively lower first threshold voltage level, and switching a pullup enhancer circuit at a relatively higher second threshold voltage level.

The preferred method contemplates switching dynamic current at the output node at the first threshold voltage level for data signal transitions at the output node and switching static current at the output node at the second threshold voltage level to reduce static current $I_{CCT}$. The first stage output pullup and pulldown circuit may be constructed for switching at a TTL input switching first threshold voltage level and the pullup enhancer circuit may be constructed for switching at a CMOS input switching second threshold voltage level.

In the preferred example, the invention provides a TTL to CMOS translating input buffer circuit with a first stage expanded pullup circuit P1 including a relatively small channel width static current restricting PMOS first pullup transistor and a relatively large current conducting dynamic current enhancing second pullup transistor. The first and second pullup transistors have primary current paths coupled in parallel to a high potential power rail. A pullup current summing PMOS third pullup transistor is coupled to the intermediate output node in series with the parallel coupled first and second pullup transistors. The first, second and third pullup transistors are coupled in the input buffer circuit for operations substantially in phase.

According to the invention the first and third pullup transistors have control gate nodes coupled to the input and form part of the first stage output pullup and pulldown circuit. The invention also provides a dynamic current enhancing and static current reducing control circuit coupled between the input and a control gate node of the current enhancing second pullup transistor. The control circuit is constructed for turning on the second pullup transistor to deliver enhanced sourcing current during an LH transition at the intermediate output node m1 to increase switching speed. The control circuit also turns off the second pullup transistor during a static low potential level data signal L at the intermediate output node m1 to reduce static current $I_{CCT}$.

In the preferred example the dynamic current enhancing and static current reducing control circuit is provided by first and second inverting CMOS stages. The control circuit inverting stages are composed of small channel width complementary PMOS and NMOS transistors for fast operation of the second pullup transistor substantially in phase with the first and second pullup transistors. The channel widths of the complementary PMOS and NMOS transistors of the control circuit inverting stages are formed with PMOS and NMOS channel width ratios selected for switching the current enhancing second pullup transistor for controlling static current at a relatively higher second threshold voltage level at the input.

The input stage output pullup and pulldown circuit includes a pulldown circuit which is provided by a relatively large channel width pulldown transistor. The large channel width pulldown transistor is coupled to the input with the first and third pullup transistors for switching dynamic current to effect a transition of the data signal potential level at the intermediate output node m1 at a relatively lower first threshold voltage level.

A feature of the dual threshold voltage first stage or input stage of the input buffer circuit of the invention is that the enhancing pullup current through the second pullup transistor is controlled separately from the switching of data signal voltage levels. The channel width or current conducting capacity of the dynamic current enhancing second pullup transistor is substantially greater than the channel width of the static current restricting first pullup transistor. Upon turning off the second pullup transistor, completely, the static current $I_{CCT}$ through the first pullup transistor is therefore limited to an acceptable specified level. The channel width of the third pullup transistor is greater than that of either the first or second pullup transistor for combining the enhanced and restricted pullup current during LH transitions at the intermediate output node m1.

According to the invention the first, second and third pullup transistors of the input buffer circuit first inverter stage are selected to provide an equivalent pullup circuit P1 effective channel width or current carrying capacity for the first stage pullup circuit substantially less than the channel width or current carrying capacity of the first stage pulldown transistor circuit N1. This skewed ratio of effective pullup channel width to pulldown channel width for example in the order of ¼ provides the desired TTL first switching threshold voltage level at the input for switching dynamic current to effect a transition of data signal voltage levels at for example 1.5 v. At the same time, the channel width ratios of the complementary PMOS and NMOS transistors of the control circuit inverter stages are selected to switch the dynamic enhancing pullup current through the second pullup transistor at a higher specified switching threshold voltage level for example in the range of 2.5 v to 3.4 v to control static current.

An advantage of this input inverter stage according to the invention is that the current enhancing second pullup transistor provides substantially increased pullup current for LH transitions at the intermediate output node in response to HL transitions at the input with increased switching speed. At the same time, the static current restricting first pullup transistor limits static current during steady state low potential level signals L at the intermediate output node to an acceptable circuit specification.

Another feature of the invention is that the effective channel width ratio for the input stage pullup circuit P1 to pulldown circuit N1 operates at approximately a standard skewed ratio value of ¼ during dynamic switching of an LH transition at the intermediate output node in response to an HL transition at the input. Furthermore the absolute values of the effective channel widths may be substantially greater, for example, four times greater than the absolute channel dimensions of a conventional input inverter stage, for substantial reduction in propagation delay and increase in switching speed. However during a steady state low potential level data signal L at the intermediate output node, the ratio of effective channel widths of the input stage pullup circuit to pulldown circuit operates in a substantially smaller ratio range of for example ⅛ to 1/16 for suppressing static current $I_{CCT}$ in order to meet required circuit specifications.

An advantage of the invention is that the respective channel dimensions and channel width ratios of the input buffer circuit input stage CMOS transistors may be scaled and selected for programming a wide range of circuit operating parameters according to the circuit application. For example the first and second dual threshold voltage levels may be programmed according to the channel width ratios selected for complementary pairs of PMOS and NMOS transistors and the effective or equivalent channel ratios of the input stage pullup and pulldown circuits P1,N1. Furthermore the absolute value sizes of the channel dimensions may be selected for achieving the desired pullup and pulldown current drive, propagation delay, and switching speed.

In an alternative embodiment of the invention, the pullup current summing third pullup transistor function is divided between current summing PMOS third and fourth pullup transistors. The third pullup transistor is coupled in series with the current enhancing second pullup transistor. The fourth pullup transistor is coupled in series with the static current restricting first pullup transistor. The pullup current summing third and fourth pullup transistors are coupled with primary current paths in parallel to the output node m1 of the expanded first stage. An advantage of this circuit arrangement is that it reduces node capacitance between the first pullup transistor and the summing fourth pullup transistor for higher dynamic switching speed.

The invention is applicable to both CMOS and combined bipolar and CMOS (BICMOS) circuits. Alternative embodiments are described for both CMOS and BICMOS circuits.

Other objects, features and advantages of the invention are apparent in the following specification and accompanying drawings.

DESCRIPTION OF PREFERRED EXAMPLE EMBODIMENTS AND BEST MODE OF THE INVENTION

Figure 2:
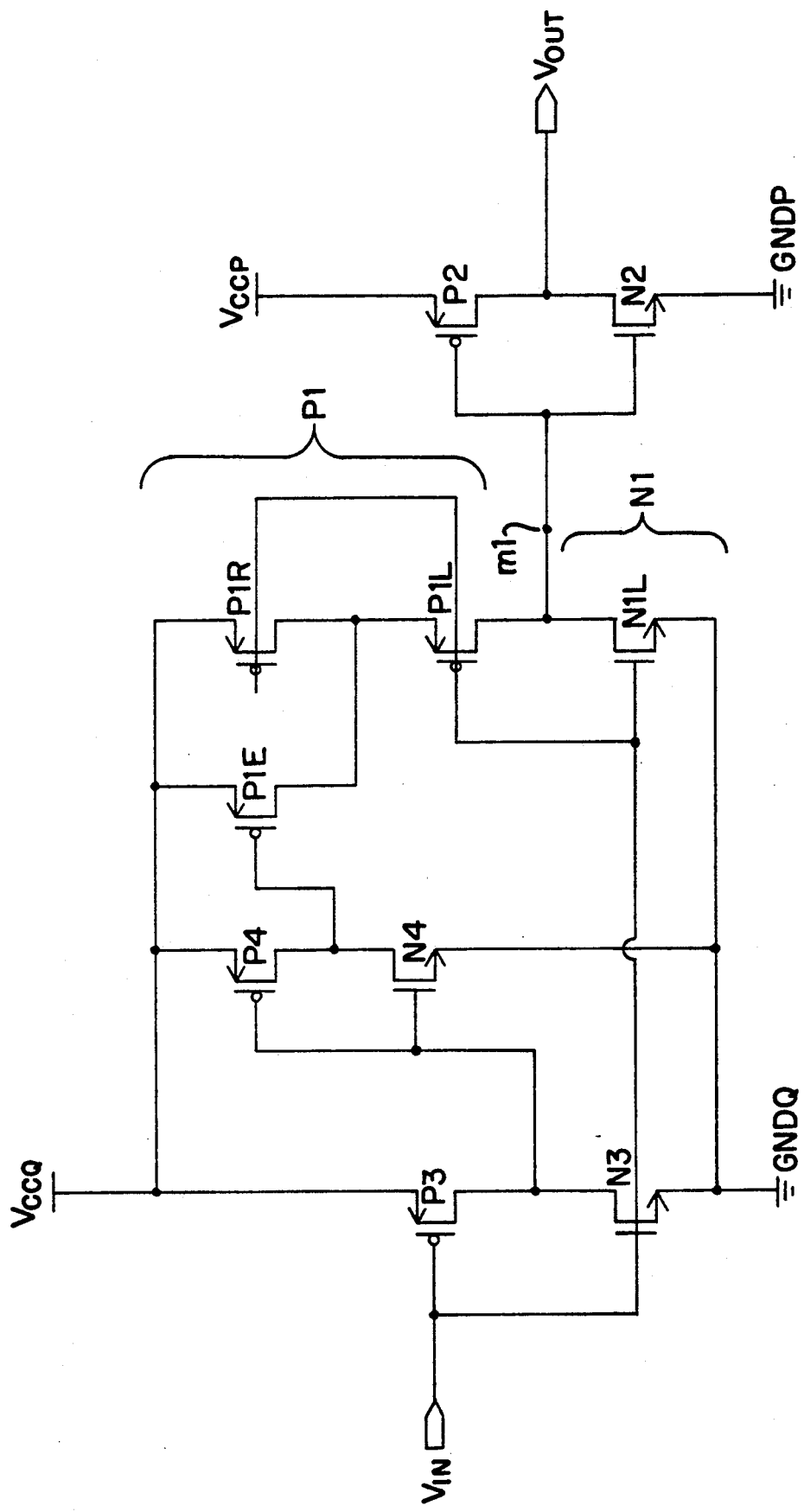
FIG. 2 is a detailed schematic circuit diagram of a TTL to CMOS translating input buffer circuit according to the invention.
Figure 2A:
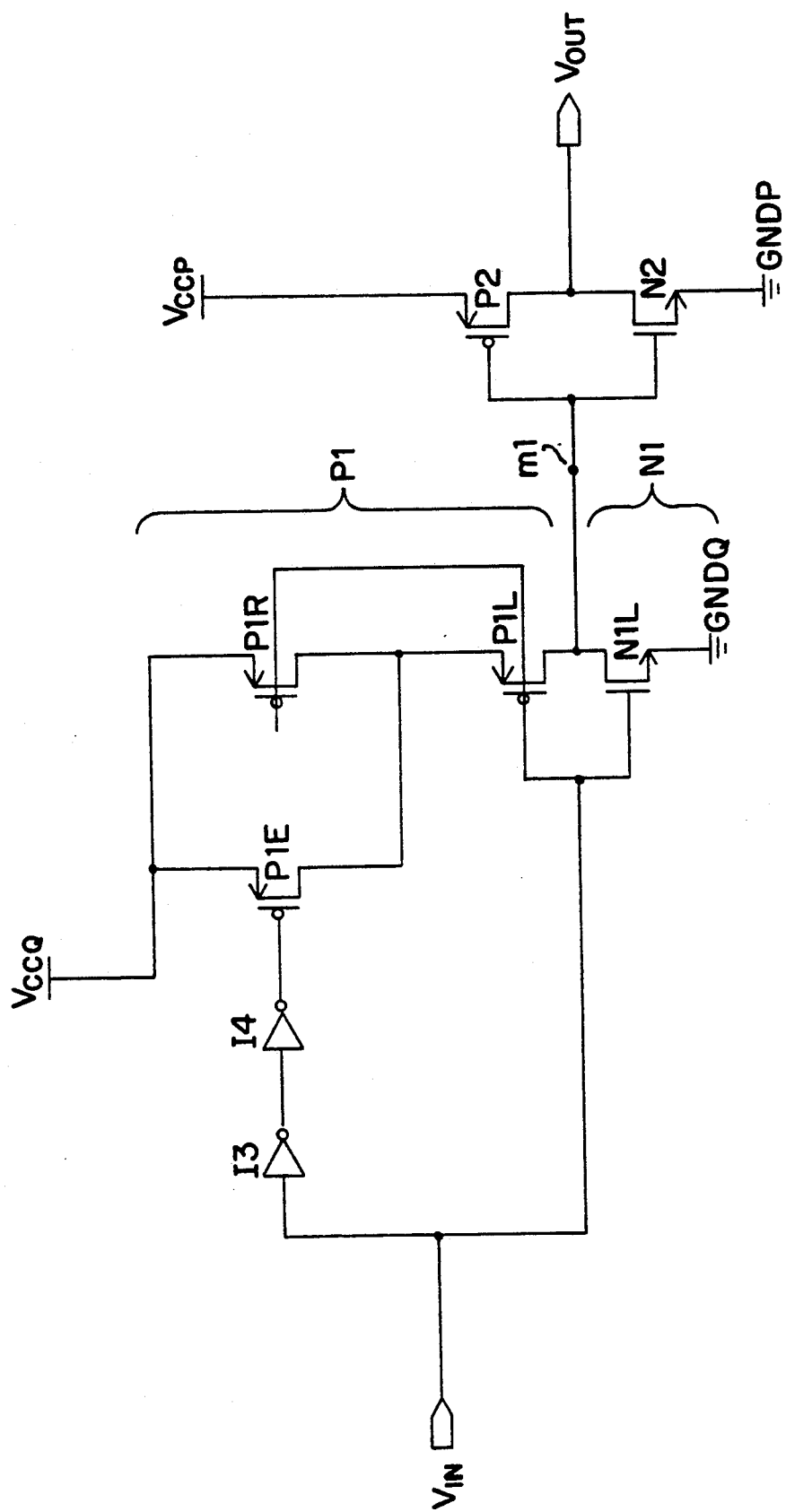
FIG. 2A is a simplified circuit diagram of the TTL to CMOS translating input buffer circuit of FIG. 2.

A TTL to CMOS translating input buffer circuit according to the invention is illustrated in FIG. 2, with a simplified equivalent circuit diagram shown in FIG. 2A. The pullup transistor circuit P1 for the input inverter stage P1,N1 has been replaced with a complex network of multiple PMOS pullup transistors P1R,P1E,P1L coupled in parallel and in series. A static current limiting first pullup transistor P1R and a current enhancing second pullup transistor P1E are coupled with primary current paths in parallel to the high potential power rail $V_{CCQ}$. A pullup current summing third pullup transistor P1L is Coupled to the intermediate output node m1 from the first inverter stage with primary current path in series with the parallel coupled transistors P1R,P1E.

The control gate nodes of the static current restricting first pullup transistor P1R and the source current combining third pullup transistor P1L are coupled directly to the TTL data signal voltage level input $V_{IN}$. Along with pulldown transistor N1L, the pullup transistors P1R and P1L form the first stage output pullup and pulldown circuit.

The control gate node of the pullup current enhancing third pullup transistor P1E is coupled to the input $V_{IN}$ through a control circuit I3,I4 hereafter described. The control circuit turns on the second pullup transistor P1E during an LH transition at intermediate output node m1 and holds transistor P1E on during a steady state high data signal H at node m1. Pullup transistor P1E and control circuit inverter stages I3,I4 form the first stage pullup enhancer circuit.

Figure 1:
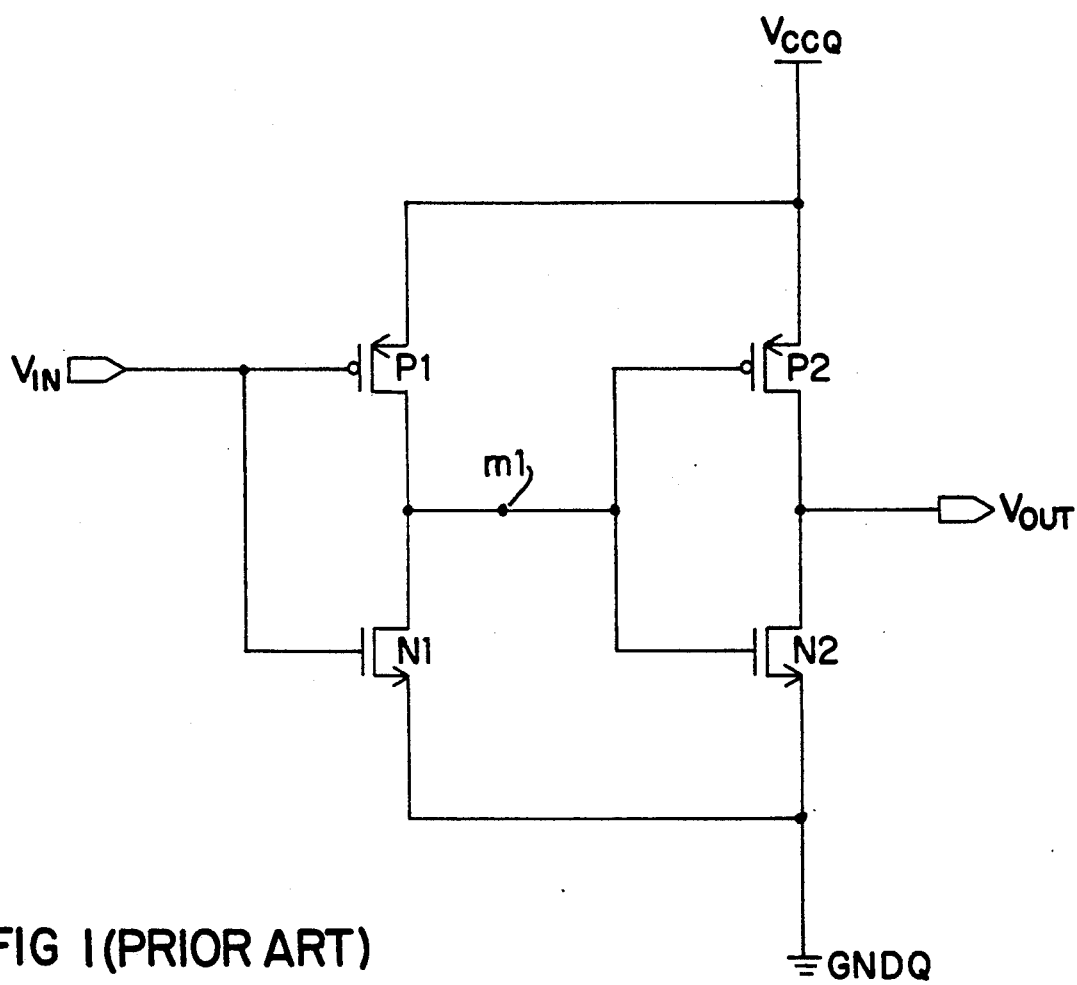
FIG. 1 is a schematic circuit diagram of a prior art TTL to CMOS translating input buffer circuit.

The first pullup transistor P1R has a relatively small channel width comparable to pullup transistor P1 in the prior art circuit of FIG. 1, for example 25 μ, and generates only a restricted sourcing current $I_{SR}$ in order to limit subsequent static current $I_{CCT}$. Because the control gate node is coupled directly to the input $V_{IN}$, it is not pulled up to the CMOS high potential power rail voltage of $V_{CCQ}$ when a TTL logic high data signal is applied at the input $V_{IN}$. The partial turn off results in static current $I_{CCT}$ through the first pullup transistor P1R.

The parallel current enhancing pullup transistor P1E is provided with a relatively large channel width, e.g. 175 μ, for generating a relatively large enhancing sourcing current $I_{SE}$ to increase sourcing current. With a low potential level signal L at the input $V_{IN}$, P1E is ready to source current. In response to an HL transition at the input $V_{IN}$, P1E generates the large enhancing sourcing current and speeds up the LH transition at intermediate output node m1. The source current third pullup transistor P1L coupled in series is provided with a sufficiently large channel width, e.g. 200 μ, to accommodate and combine the restricted source current $I_{SR}$ and enhancing source current $I_{SE}$ to deliver a large enhanced pullup current $I_{SL}$ at the intermediate output node m1.

The pulldown circuit N1 is provided by a relatively large channel width NMOS pulldown transistor N1L. The transistors of the pullup and pulldown circuits P1,N1 are sized in relation to each other as follows. The equivalent pullup circuit channel width of the network of pullup transistors P1R,P1E,P1L when all the pullup transistors are conducting is selected to provide an input stage ratio of equivalent pullup circuit channel width to the channel width of pulldown transistor N1L of, for example, ¼. This establishes the desired TTL switching threshold voltage level at the input $V_{IN}$ of approximately 1.5 volts. In the example summarized in TABLE I, the equivalent pullup circuit channel width of pullup network P1R,P1E,P1L is 100 μ while the channel width of the pulldown transistor N1L is 400 μ.

It is apparent that the circuit of FIGS. 2 and 2A permits substantially greater channel width pullup and pulldown circuits P1,N1 than the prior art circuit of FIG. 1. In the example of TABLE I, the current drive capacity of the input inverter stage is 4 times that of the circuit of FIG. 1 for greater output load capacity and higher switching speed.

During a steady state low potential data signal L at intermediate output node m1 in response to a TTL high potential data signal at the input $V_{IN}$, the dynamic current enhancing second pullup transistor P1E is fully turned off as hereafter described, so that unwanted static current is limited to the 25 μ channel width first pullup transistor P1R. Undesirable static current is therefore limited to the same specifications as the circuit of FIG. 1. The effective channel width ratio of the pullup and pulldown circuits P1,N1 for the circuit of FIG. 2 is therefore 1/16 during static current conditions. Operation of the control circuit I3,I4 to achieve this result is described with reference to the example of TABLE I.

TABLE I

| Transistor Channel Widths in Microns | |
|---|---|
| P1R | 25μ |
| P1E | 175μ |
| P1L | 200μ |
| N1L | 400μ |
| P3 | 20μ |
| N3 | 6μ |
| P4 | 6–12μ |
| N4 | 6–12μ |
| P2 | 150μ |
| N2 | 150μ |

The control circuit at the gate node of PMOS transistor P1E consists of two inverter stages I3,I4. The inverter stage I3 comprises a pair of complementary CMOS transistors P3,N3 and inverter stage I4 comprises complementary CMOS transistors P4,N4. The absolute channel width sizes of the inverter stage CMOS transistors P3,N3, P4,N4 are small for fast switching so that the enhancing second pullup transistor P1E operates substantially in phase with the first and third pullup transistors P1R,P1L which are coupled directly to the input $V_{IN}$. However, the ratio of respective channel widths of the control circuit complementary CMOS transistors P3/N3 is selected to provide a higher second switching threshold voltage level for switching on and off the second pullup transistor P1E and dynamic enhancing pullup current $I_{SE}$. In the example of TABLE I the channel width ratio for P3/N3 is skewed to establish a second threshold voltage level at the input of, for example in the range of 2.5 v to 3.4 v. Data signal voltage levels at input node $V_{IN}$ and output node $V_{OUT}$ are thus switched at the lower TTL first threshold voltage of approximately 1.5 v while the pullup enhancing current through second pullup transistor P1E is switched at the higher CMOS second threshold voltage of approximately 2.5 to 3.4 v.

Figure 4:
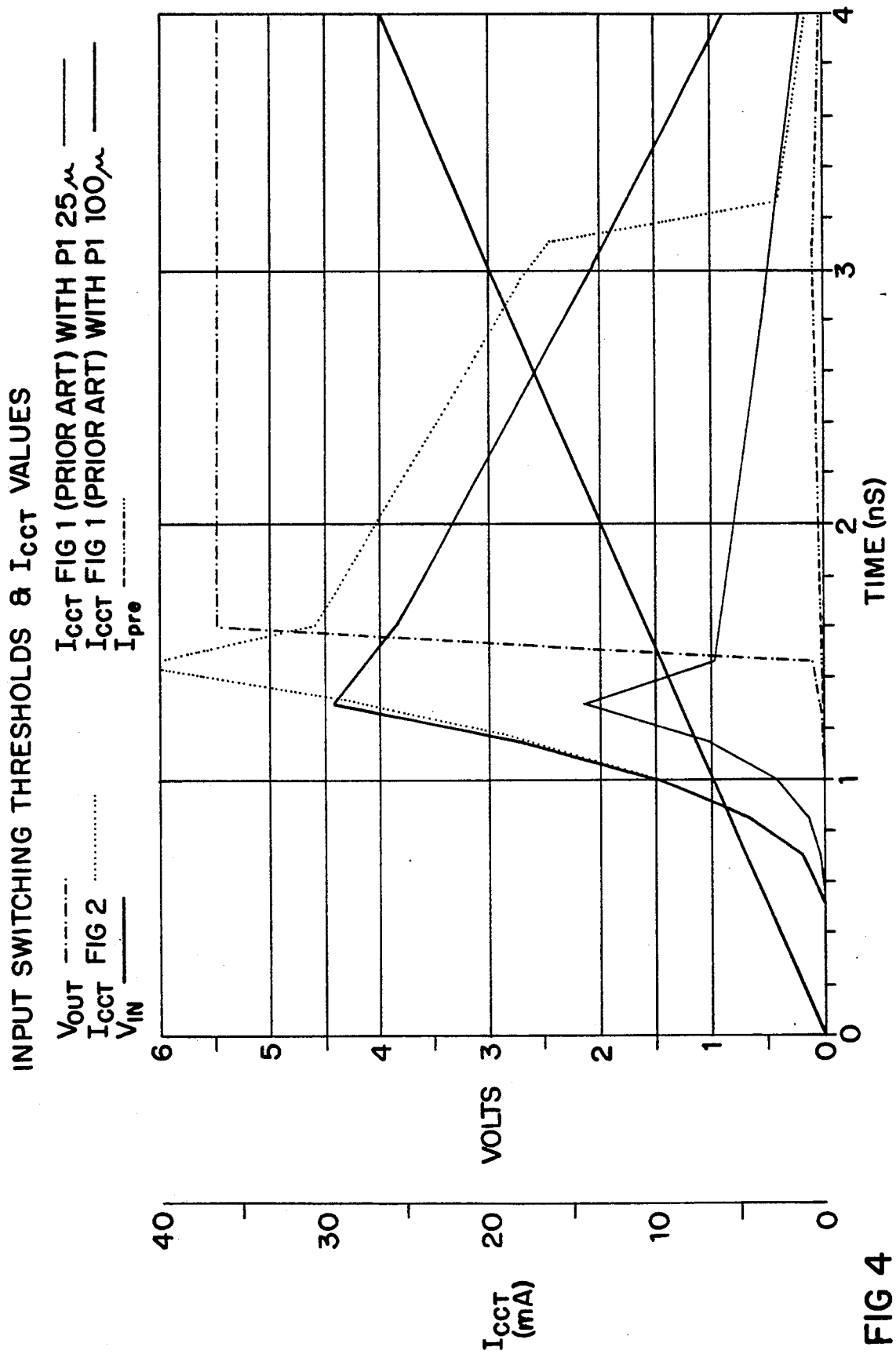
FIG. 4 is a graph comparing input switching threshold voltage levels at static current $I_{CCT}$ values for the circuits of FIG. 1 & 2 including comparison with the circuit of FIG. 1 for different channel width values for the pullup circuit PMOS transistor.

With a low to high data signal transition LH at the input $V_{IN}$, the large NMOS pulldown transistor N1L turns on and initiates the high to low data signal transition HL at intermediate output node m1 and the final low to high data signal transition LH at the output $V_{OUT}$. Switching occurs at the relatively lower TTL first switching threshold voltage level of approximately 1.5 v as illustrated in the graph of FIG. 4. As pulldown transistor N1L turns on there is a jump to a maximum peak in static current $I_{CCT}$ because the network of pullup transistors P1R,P1E,P1L of the pullup circuit P1 are all still on from the previous low data signal condition L at the input $V_{IN}$. As the voltage level at the input rises, the first and third pullup transistors P1R,P1L having gate nodes coupled directly to the input $V_{IN}$ begin to turn off reducing the crowbar current $I_{CCT}$ as further shown in the graph of FIG. 4.

When the data signal voltage level at the input $V_{IN}$ rises to a relatively higher CMOS second switching threshold voltage level, the control circuit inverter stages I3,I4 turn off the current enhancing second pullup transistor P1E. The PMOS transistor P4 of inverter stage I4 pulls up the gate node of dynamic current enhancing pullup transistor P1E to the CMOS high potential level voltage of the high potential power rail $V_{CCQ}$ so that it is entirely off. No static current passes through transistor P1E. There is a final drop in the static current $I_{CCT}$ as shown in the graph of FIG. 4 to the minimum acceptable level of static current passing through the first pullup transistor P1R. The channel width dimension of the static current restricting pullup transistor P1R can therefore be selected to meet the specification for the circuit.

The graph of FIG. 4 provides a comparison of the crowbar current $I_{CCT}$ of the new circuit of FIG. 2 with the prior art circuit of FIG. 1. For purposes of standardized $I_{CCT}$ measurement and testing, a high potential level signal H of 3.4 v is applied at the input $V_{IN}$ for the measurement of $I_{CCT}$ shown in the graph of FIG. 4. Results for the circuit of FIG. 1 are shown with two different channel width dimension values for the input stage pullup transistor P1. It is apparent that the circuit of FIG. 2 combines the advantage of the large dynamic switching current afforded by a relatively large channel width dimension pullup circuit P1 (100 μ) with the advantages of a limited static current comparable to a small channel width dimension pullup circuit P1 (25 μ). An additional small $I_{CCT}$ component $I_{PRE}$ which passes through inverter stage I3 is also shown in the graph of FIG. 4.

Figure 3:
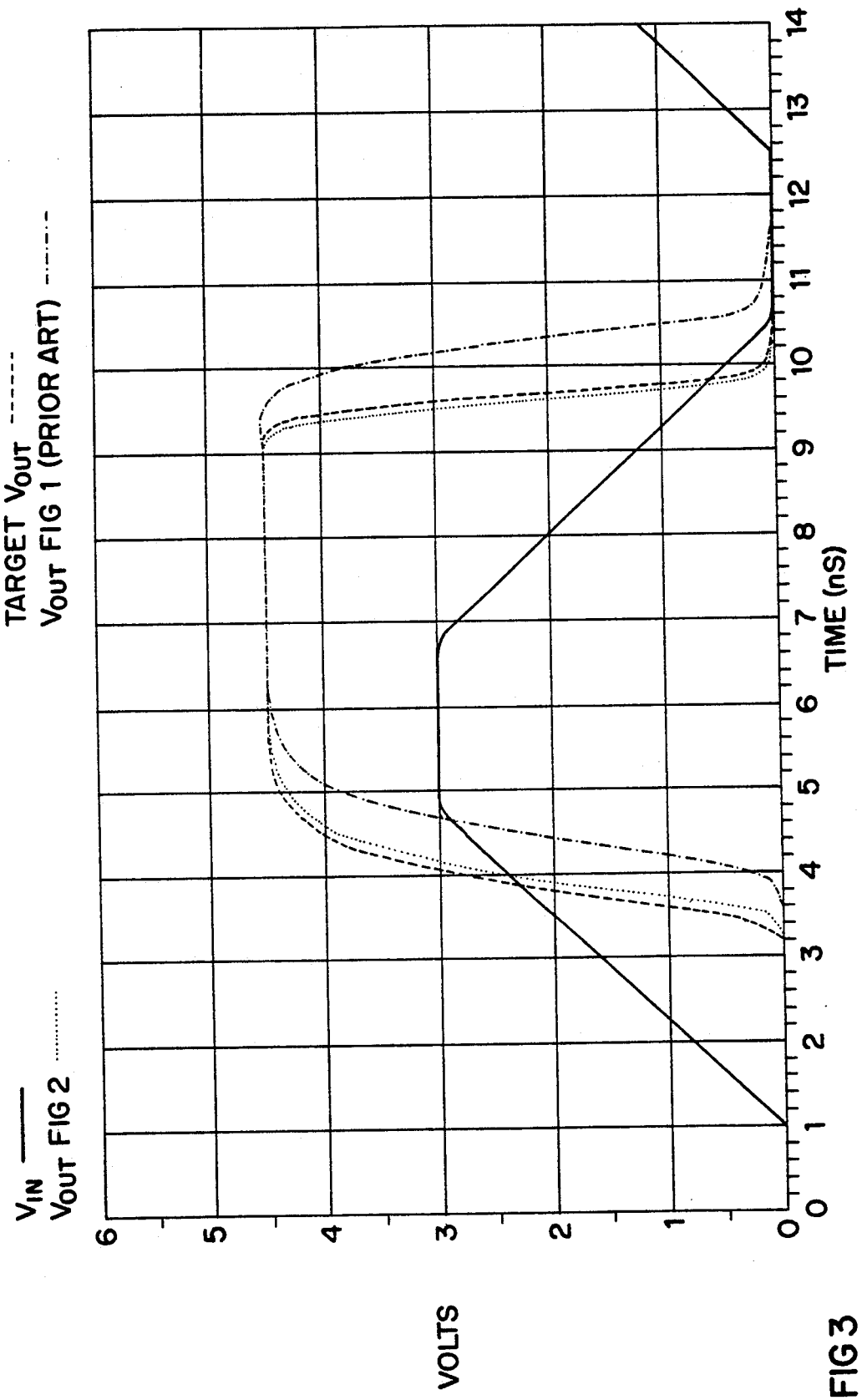
FIG. 3 is a graph comparing the propagation delay for the circuits of FIGS. 1 & 2.

A comparison of the propagation delays for the respective circuits of FIGS. 1 and 2 is shown in the graph of FIG. 3. The circuit of FIG. 2 initiates and completes the data signal switching transitions in reduced time intervals with an increase in switching speed of approximately 10%. This is achieved with the increased dynamic current drive equivalent to a channel dimension ratio of the pullup circuit P1 to pulldown circuit N1 of approximately 100/400, four times greater than the prior art circuit of FIG. 1. Yet static current $I_{CCT}$ is restricted to the same level as the small channel dimension pullup transistor P1 of FIG. 1.

The absolute values of the channel dimensions, and the channel width ratios of the CMOS transistor pairs are scaleable and programmable to achieve whatever dynamic current and static current performance is required for a particular circuit application. An example of an input buffer circuit having an input stage with even greater dynamic current current drive yet with the same restricted static current $I_{CCT}$ is set forth in TABLE II.

TABLE II

| Channel Width Values in Microns | |
|---|---|
| P1R | 25μ |
| P1E | 375μ |
| P1L | 400μ |
| N1L | 800μ |

It is noted that in the circuit of FIGS. 2 and 2A, the first stage pullup and pulldown circuits P1,N1, and the second stage P2,N2, are coupled to separate high and low potential power rails $V_{CCQ}$, $V_{CCP}$, and GNDQ, GNDP. Such separate power rails are optional and provide noise isolation between input and output stages. The power rails may be entirely separate. Or, alternatively, relative separation of the respective "quiet" ($V_{CCQ}$,GNDQ) and "noisy" ($V_{CCP}$,GNDP) power rails can be provided, for example, using split lead lead frames as described in U.S. Pat. No. 5,065,224 issued Nov. 12, 1991.

Figure 5:
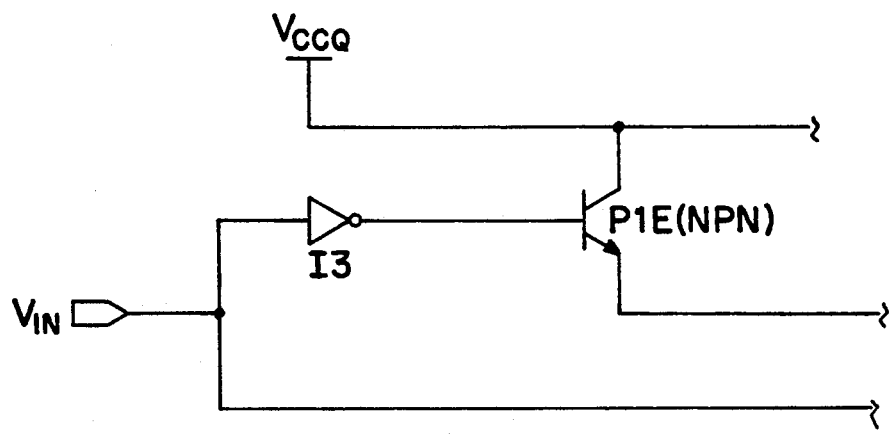
FIG. 5 is a fragmentary schematic circuit diagram of a BICMOS circuit modification of the input buffer circuit of FIGS. 2 and 2A replacing the PMOS current enhancing second pullup transistor P1E with a bipolar NPN transistor P1E (NPN).

The CMOS input buffer circuit of FIGS. 2 and 2A may be modified for BICMOS circuit applications incorporating both CMOS and bipolar transistors. In the example of FIG. 5 the current enhancing second pullup transistor P1E is replaced by a bipolar NPN transistor P1E (NPN). Use of an NPN bipolar transistor P1E (NPN) permits elimination of one of the inverter stages I4 of the control circuit I3,I4 as shown in FIG. 5. All other elements of the input buffer circuit of FIG. 2A remain the same. Because the NPN bipolar transistor P1E (NPN) turns off in response to a low potential level data signal at the base node, it operates in phase with the first and third PMOS pullup transistors P1R,P1L with only a single control circuit inverter stage I3.

Figure 6:
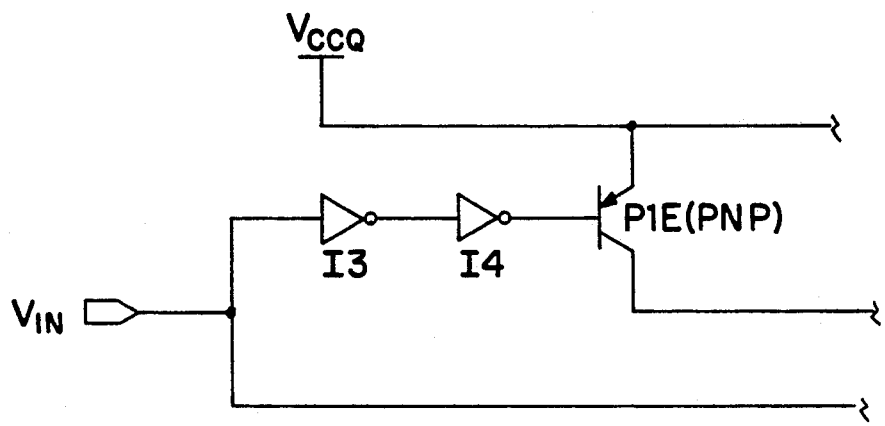
FIG. 6 is a fragmentary schematic circuit diagram of another BICMOS circuit modification of the input buffer circuit of FIGS. 2 and 2A replacing the PMOS dynamic current enhancing second pullup transistor P1E with a bipolar PNP transistor P1E (PNP).

In the BICMOS circuit modification example of FIG. 6, the PMOS current enhancing second pullup transistor P1E is replaced with a PNP bipolar transistor P1E (PNP). The PNP bipolar transistor is analogous in the logic of its operation with a PMOS transistor and turns on in response to a low potential level data signal at the base node. Both inverter stages of the control circuit I3,I4 are therefore retained for operation of the PNP bipolar transistor P1E (PNP) in phase with the first and third PMOS pullup transistors P1R,P1L. The remaining portions of the circuit of FIG. 6 are the same as the input buffer circuit of FIG. 2A. A further BICMOS circuit modification of the input buffer circuit is that the second stage or output stage CMOS transistors P2,N2 may be replaced with bipolar pullup and pulldown transistors.

Figure 7:
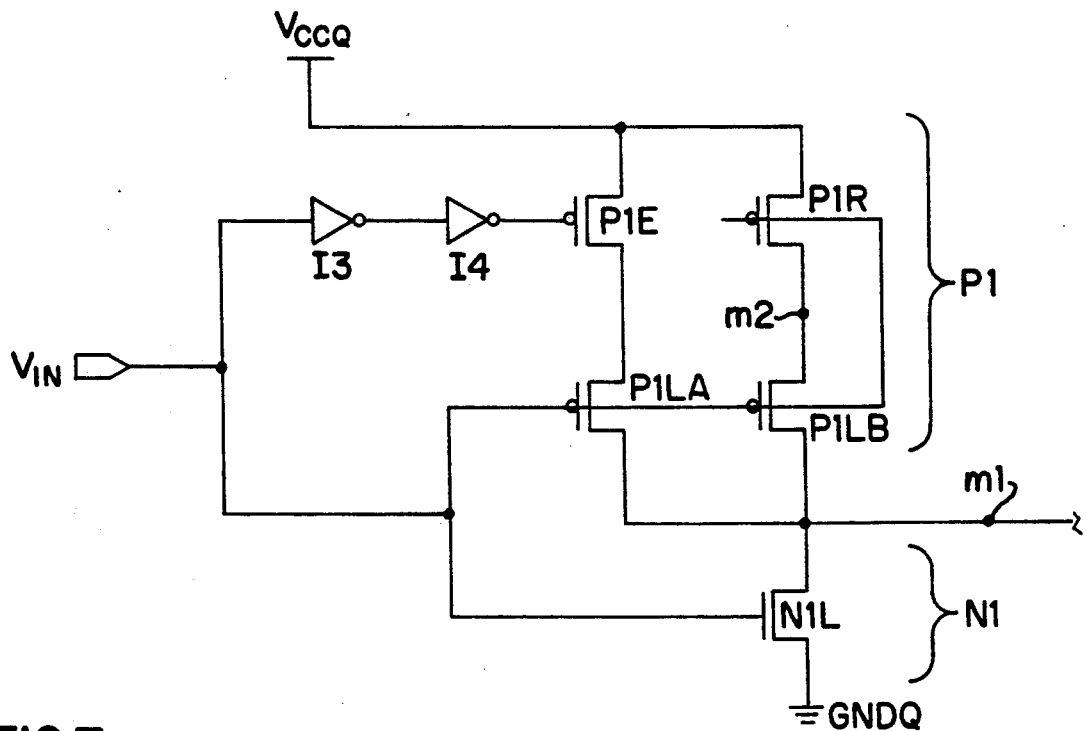
FIG. 7 is a fragmentary schematic circuit diagram showing an alternative circuit modification of the input buffer circuit of FIGS. 2 and 2A in which the pullup current summing third pullup transistor P1L function is divided between pullup current summing third and fourth pullup transistors P1LA and P1LB coupled in parallel.

An alternative embodiment of the input buffer circuit of FIGS. 2 and 2A is illustrated in the fragmentary schematic circuit diagram of FIG. 7. In this example the pullup current summing function of the PMOS third pullup transistor P1L of FIGS. 2 and 2A is divided between current summing third and fourth pullup transistors P1LA and P1LB as shown in FIG. 7. The current summing third pullup transistor P1LA is coupled in series with the current enhancing second pullup transistor P1E. The current summing fourth pullup transistor P1LB is coupled in series with the static current restricting first pullup transistor P1R. The third and fourth pullup transistors P1LA and P1LB are in turn coupled in parallel to the intermediate output node m1. An advantage of the circuit configuration of FIG. 7 is that it reduces capacitance at an intermediate node m2 between the first pullup transistor P1R and the fourth pullup transistor P1LB. This reduced capacitance at node m2 improves dynamic switching speed at intermediate output node While the invention has been described with respect to particular example embodiments it is intended to cover all modifications and equivalents within the scope of the following claims.

I claim:

1. A TTL to CMOS translating input buffer circuit having an input ($V_{IN}$) for receiving data signals of high (H) and low (L) potential levels, and an output node (m1) for passing data signals, said input buffer circuit comprising a first stage having a pullup circuit coupled for sourcing current to an output node (m1) and a pulldown circuit coupled for sinking current from the output node (m1), said pullup and pulldown circuits having control gate nodes coupled to the input ($V_{IN}$), the improvement comprising:

said pullup and pulldown circuits being constructed to provide dual switching thresholds at the input ($V_{IN}$) including a data input stage (P1R,P1L,N1L) coupled to the input ($V_{IN}$) having a relatively lower first switching threshold voltage level for switching dynamic current at the output node (m1) and a current enhancement stage (I3) coupled to the input ($V_{IN}$) having a relatively higher second switching threshold voltage level for switching static current at the output node (m1).

2. The TTL to CMOS translating input buffer circuit of claim 1 wherein the relatively lower first threshold voltage level of the data input stage is substantially at a TTL input switching threshold voltage level and wherein the relatively higher second threshold voltage level of the current enhancement stage is substantially at a CMOS input switching threshold voltage level.

3. The TTL to CMOS translating input buffer circuit of claim 1 wherein the data input stage comprises a first stage pullup and pulldown circuit (P1R,P1L,N1L) constructed for switching dynamic current at the output node (m1) at the relatively lower first threshold voltage level for data signal transitions between high and low potential levels at the output node (m1), and wherein the current enhancement stage comprises a pullup enhancer circuit (P1E,I3,I4) for enhancing pullup current at the output node m1 and for switching static current ($I_{CCT}$) through the output node (m1) at the relatively higher second threshold voltage level to reduce static current ($I_{CCT}$) during a static low potential level data signal (L) at the output node (m1).

4. The TTL to CMOS translating input buffer circuit of claim 3 wherein the pullup and pulldown circuits each comprise an inverting stage.

5. The TTL to CMOS translating input buffer circuit of claim 1 wherein said pullup circuit comprises a relatively small channel width static current ($I_{CCT}$) restricting PMOS first pullup transistor (P1R) and a relatively large current capacity current enhancing second pullup transistor (P1E), said first and second pullup transistors (P1R,P1E) having primary current paths coupled in parallel to a high potential power rail ($V_{CCQ}$), and a pullup current summing PMOS third pullup transistor (P1L) coupled to the output node (m1) in series with the parallel coupled first and second pullup transistors (P1E P1R), said first, second and third pullup transistors (P1R, P1E, P1L) being coupled for operation substantially in phase.

6. The input buffer circuit of claim 5 wherein the first and third pullup transistors (P1R,P1L) have control gate nodes coupled to the input ($V_{IN}$), and further comprising a current enhancing control circuit I3, I4) coupled between the input ($V_{IN}$) and a control gate node of the current enhancing second pullup transistor (P1E), said control circuit (I3, I4) being constructed for turning on the second pullup transistor (P1E) to deliver enhanced sourcing current ($I_{SE}$) during an LH transition at the output node (m1) to increase switching speed and for turning off the second pullup transistor (P1E) during a static low potential level data signal (L) at the output node (m1) to reduce static current ($I_{CCT}$).

7. The input buffer circuit of claim 6 wherein the channel width of the current enhancing second pullup transistor (P1E) is substantially greater than the channel width of the static current restricting first pullup transistor (P1R) and wherein the channel width of the third pullup transistor (P1L) is greater than that of either the first or second pullup transistors (P1E, P1R).

8. The input buffer circuit of claim 6 wherein the current enhancing control circuit comprises inverting CMOS stages (I3, I4) in turn comprising small channel width complementary PMOS and NMOS transistors (P3,N3; P4,N4) for operation of the second pullup transistor (P1E) substantially in phase with the first and second pullup transistors (P1R,P1E).

9. The input buffer circuit of claim 8 wherein the complementary PMOS and NMOS transistors (P3,N3; P4,N4) of the current enhancing control circuit are formed with PMOS and NMOS channel width ratios selected for switching the current enhancing third pullup transistor (P1E) at the relatively higher second threshold voltage level at the input ($V_{IN}$), and wherein the pulldown circuit comprises a relatively large channel width pulldown transistor (N1L) coupled to the input ($V_{IN}$) with the first and third pullup transistors (P1R,P1L) for switching the data signal potential level at the output node (m1) at the relatively lower first threshold voltage level at the input ($V_{IN}$).

10. The input buffer circuit of claim 9 wherein the CMOS pulldown circuit comprises a relatively large channel width NMOS transistor (N1L), and wherein the first, second, and third pullup transistors (P1R,P1E,P1L) are selected to provide an equivalent circuit effective channel width for the pullup circuit substantially less than the channel width of the pulldown transistor (N1L) for a skewed ratio of effective channel widths.

11. The TTL to CMOS translating input buffer circuit of claim 1 wherein said pullup circuit comprises a relatively small channel width static current ($I_{CCT}$) restricting PMOS first pullup transistor (P1R) and a relatively large current carrying capacity current enhancing second pullup transistor (P1E), said first and second pullup transistors (P1R,P1E) having primary current paths coupled in parallel to a high potential power rail ($V_{CCQ}$), and pullup current summing PMOS third and fourth pullup transistors (P1LA,P1LB) coupled in parallel to the output node (m1), said third pullup transistor (P1LA) being coupled in series with the second pullup transistor (P1E), and said fourth pullup transistor (P1LB) being coupled in series with the first pullup transistor (P1R), said first, second, third and fourth pullup transistors (P1R,P1E,P1LA,P1LB) being coupled for operation substantially in phase.

12. The input buffer circuit of claim 11 wherein the second pullup transistor (P1E) of the pullup circuit is coupled to the input ($V_{IN}$) through at least one CMOS pullup stage (I3,I4) comprising complementary CMOS transistors including relatively small channel width PMOS and NMOS transistors (P3,N3; P4,N4) for operation of the second pullup transistor (P1E) substantially in phase with the first and third pullup transistors (P1R,P1L).

13. The input buffer circuit of claim 12 wherein the complementary PMOS and NMOS transistors (P3,N3; P4,N4) of the current enhancing control circuit are formed with PMOS and NMOS channel width ratios selected for switching the current enhancing second pullup transistor (P1E) at the relatively higher second threshold voltage level at the input ($V_{IN}$), and wherein the pulldown circuit comprises a relatively large channel width pulldown transistor (N1L) coupled to the input ($V_{IN}$) with the first and third pullup transistors (P1R,P1L) for switching the data signal potential level at the output node (m1) at the relatively lower first threshold voltage level at the input ($V_{IN}$).

14. The input buffer circuit of claim 13 wherein the pulldown circuit comprises a relatively large channel width NMOS transistor (N1L), and wherein the first, second, third, and fourth pullup transistors (P1R,P1E,P1LA, P1LB) are selected to provide an equivalent circuit effective channel width for the pullup circuit substantially less than the channel width of the pulldown transistor (N1L) for a skewed ratio of effective channel widths.

15. The input buffer circuit of claim 14 wherein the channel width dimensions of the respective transistors and the ratio of channel width dimensions of the complementary PMOS and NMOS transistors are selected so that the first threshold voltage level comprises a relatively lower TTL switching threshold voltage level.

16. A method of buffering input data signals at the input ($V_{IN}$) of an input buffer circuit having pullup and pulldown circuits coupled to an output node (m1) comprising:

switching dynamic current at the output node (m1) by switching a data input stage coupled to the input ($V_{IN}$) having a relatively lower first switching threshold voltage level for implementing data signal transitions at the output node m1 and switching static current at the output node (m1) by switching a current enhancement stage (I3) coupled to the input ($V_{IN}$) having a relatively higher second switching threshold voltage level to reduce static current ($I_{CCT}$).

17. The method of claim 16 comprising switching dynamic current at a TTL first threshold voltage level for data signal transitions and switching static current at a CMOS second switching threshold voltage level for reducing static current ($I_{CCT}$).

18. A method of buffering input data signals of high (H) and low (L) potential levels at an input ($V_{IN}$) for TT1 to CMOS translation and for delivering data signals at an output node (m1) with increased switching speed during LH transitions at the output node (m1) and with reduced static current ($I_{CCT}$) during a static low potential level data signal (L) at the output node (m1) comprising:

generating a restricted sourcing current ($I_{SR}$), generating a separate parallel enhancing sourcing current ($I_{SE}$), and combining the restricted and enhancing sourcing currents to provide an enhanced pullup current ($I_{SL}$) at the output node (m1) to effect an LH transition at the output node (m1) with increased switching speed;

and turning off the enhancing sourcing current ($I_{SE}$) during an HL transition at the output node (m1) and holding off the enhancing sourcing current ($I_{SE}$) during a static low potential level data signal (L) at the output node (m1) to reduce static current ($I_{CCT}$).

19. The method of claim 18 comprising the step of generating a large sinking current from the output node (m1) at a relatively lower first switching threshold voltage level at the input ($V_{IN}$) for effecting an HL transition at the output node (m1), and turning off the enhancing sourcing current ($I_{SE}$) at a relatively higher second switching threshold voltage level at the input ($V_{IN}$).

20. The method of claim 19 wherein the first switching threshold voltage level is a relatively lower TTL switching threshold voltage level and the second switching threshold voltage level is a relatively higher CMOS switching threshold voltage level.

21. The method of claim 20 wherein the step of effecting an LH transition at the output comprises turning on the enhancing sourcing current ($I_{SE}$) at said relatively higher second switching threshold voltage level before turning off the sinking current at the output node (m1) at said relatively lower first switching threshold voltage level.

22. A TTL to CMOS translating input buffer circuit having an input ($V_{IN}$) for receiving data signals of high (H) and low (L) potential levels, and an output node (m1) for passing data signals, said input buffer circuit comprising an input stage having a pullup circuit (P1) coupled for sourcing current to the output node (m1) and a pulldown circuit (N1) coupled for sinking current form the output node (m1), said pullup and pulldown circuits having control gate nodes coupled to the input ($V_{IN}$), the improvement for enhancing dynamic current during transitions at the output node (m1) for increasing switching speed while restricting static current ($I_{CCT}$) during static low data signals (L) at the output node (m1) comprising:

said pullup circuit (P1) comprising a relatively small channel width static current ($I_{CCT}$) restricting PMOS first pullup transistor (P1R) and a relatively large current conducting current enhancing second pullup transistor (P1E), said first and second pullup transistors (P1R,P1E) having primary current paths coupled in parallel to a high potential power rail ($V_{CCQ}$), and at least one pullup current summing PMOS pullup transistor (P1L,P1LA, P1LB) coupled to the output node (m1) in series with at least one of the parallel coupled first and second pullup transistors (P1E,P1R), said first pullup transistor (P1R) and said at least one current summing PMOS pullup transistor (P1L,P1LA,P1LB) having control gate nodes coupled to the input $V_{IN}$;

a current enhancing control circuit (I3, I4) coupled between the input ($V_{IN}$) and a control gate node of the current enhancing second pullup transistor (P1E), said control circuit (I3, I4) being constructed for turning on the second pullup transistor (P1E) to deliver enhanced sourcing current ($I_{SE}$) during an LH transition at the output node (m1) to increase switching speed and for turning off the second pullup transistor (P1E) during a static low potential level data signal (L) at the output node (m1) to reduce static current ($I_{CCT}$);

said current enhancing control circuit comprising at least one inverting CMOS stage (I3, I4) in turn comprising relatively small channel width complementary PMOS and NMOS transistors (P3,N3; P4,N4) for operation of the second pullup transistor (P1E) substantially in phase with the first and second pullup transistors (P1R,P1E).

23. The input buffer circuit of claim 22 wherein the complementary PMOS and NMOS transistors (P3,N3; P4,N4) of the current enhancing control circuit are formed with PMOS and NMOS channel width ratios selected for switching the current enhancing third pullup transistor (P1E) at a relatively higher current switching second threshold voltage level at the input ($V_{IN}$), and wherein the pulldown circuit (N1) comprises a relatively large channel width pulldown transistor (N1L) coupled to the input ($V_{IN}$) with the firs and third pullup transistors (P1R,P1L) for switching the data signal potential level at the output node (m1) at a relatively lower first threshold voltage level at the input ($V_{IN}$).

24. The input buffer circuit of claim 23 wherein the channel width dimensions of the respective transistors and the ratio of channel width dimensions of the complementary PMOS and NMOS transistors are selected so that the first threshold voltage level comprises a TTL switching threshold voltage level ($V_{TTL}$) and so that the second threshold voltage level comprises a CMOS switching threshold voltage level ($V_{TCMOS}$).

25. The input buffer circuit of claim 24 wherein the pulldown circuit (N1) comprises a relatively large channel width NMOS transistor (N1L), and wherein the first, second, and at least one current summing pullup transistors (P1R,P1E,P1L,P1LA,P1LB) are selected to provide an equivalent circuit effective channel width for the pullup circuit (P1) substantially less than the channel width of the pulldown transistor (N1L) for a skewed ratio of channel widths in order to establish a TTL first threshold voltage level.

* * * * *